United States Patent
Magni et al.

(10) Patent No.: US 7,061,697 B2
(45) Date of Patent: Jun. 13, 2006

(54) METHOD FOR FIXING A LENS OF AN OPTIC GROUP WITH RESPECT TO AN OPTICAL SENSOR INSIDE AN ELECTRONIC DEVICE ABLE TO ACQUIRE IMAGES AND CORRESPONDING DEVICE

(75) Inventors: Pierangelo Magni, Villasanta (IT); Remi Brechignac, Grenoble (FR); Chek Lim Kho, Singapore (SG); Kum Weng Loo, Singapore (SG)

(73) Assignees: STMicroelectronics SA, Montrouge (FR); STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 10/895,012

(22) Filed: Jul. 19, 2004

(65) Prior Publication Data

US 2005/0046973 A1    Mar. 3, 2005

(30) Foreign Application Priority Data

Jul. 17, 2003    (EP) .................................. 03291781

(51) Int. Cl.
*G02B 7/02* (2006.01)
*H01J 40/14* (2006.01)
*H01L 27/00* (2006.01)
*H01L 21/00* (2006.01)

(52) U.S. Cl. ...................... 359/811; 359/820; 359/819; 250/239; 250/208.1; 250/216; 438/64

(58) Field of Classification Search ................ 359/811, 359/819, 820, 823, 245, 246, 248; 250/239, 250/216, 208.1; 438/64, 48, 69
See application file for complete search history.

(56) References Cited

U.S. PATENT DOCUMENTS 6,266,197 B1 * 7/2001 Glenn et al. ................ 359/819
6,462,895 B1 * 10/2002 Hunter ........................ 359/819
6,483,101 B1 * 11/2002 Webster ...................... 250/216
6,627,872 B1 * 9/2003 FuKamura et al. ......... 250/239
6,683,298 B1 * 1/2004 Hunter et al. ............... 250/239
6,791,076 B1 * 9/2004 Webster ...................... 250/239
6,842,300 B1 * 1/2005 Magni et al. ................ 359/819
6,900,913 B1 * 5/2005 Chen .......................... 358/474
6,940,058 B1 * 9/2005 Shiau ...................... 250/208.1
6,946,316 B1 * 9/2005 Glenn et al. .................. 438/64
6,956,201 B1 * 10/2005 Webster ...................... 250/239
2002/0012178 A1   1/2002 Noguchi
2003/0123808 A1   7/2003 Powell et al.

(Continued)

FOREIGN PATENT DOCUMENTS

| DE | 37 05 408 C1 | 8/1988 |
| JP | 05022640 | 1/1993 |
| JP | 2001111155 | 4/2001 |
| JP | 2001188155 | 7/2001 |
| JP | 2001218088 | 8/2001 |
| JP | 2003057496 | 2/2003 |

* cited by examiner

OTHER PUBLICATIONS

European Search Report for EP 03 29 1781 dated Dec. 12, 2003.

*Primary Examiner*—Loha Ben
(74) *Attorney, Agent, or Firm*—Lisa K. Jorgenson; Bryan A. Santarelli; Graybeal Jackson Haley LLP

(57) ABSTRACT

A method is described for fixing a lens of an optical group with respect to an optical sensor in an image acquisition device comprising the steps of housing the optical sensor in a housing, fixing a lower holder of the optical group to the housing, aligning an upper holder of the optical group, wherein the lens is placed, with the sensor so as to align a focusing point of the lens with respect to the sensor, welding the upper holder to the lower holder. The welding step may be performed by means of ultrasounds.

39 Claims, 5 Drawing Sheets

METHOD FOR FIXING A LENS OF AN OPTIC GROUP WITH RESPECT TO AN OPTICAL SENSOR INSIDE AN ELECTRONIC DEVICE ABLE TO ACQUIRE IMAGES AND CORRESPONDING DEVICE

PRIORITY CLAIM

This application claims priority from European patent application No. 03291781.7, filed Jul. 17, 2003, which is incorporated herein by reference.

TECHNICAL FIELD

The present invention relates generally to a method for fixing an optical group lens with respect to an optical sensor in an image acquisition device. The invention also relates to an image acquisition device comprising an optical sensor placed in a housing and an optical group comprising in turn a lower holder fixed to said housing and an upper holder wherein a lens of said optical group is placed. The invention relates particularly, but not exclusively, to a method for fixing a lens in a plastic package of a camera having such functional characteristics as to allow that fixing to be stable in the following assembly steps of the camera itself and the following description is made with reference to this field of application for convenience of illustration only.

BACKGROUND

As it is well known, portable image acquisition devices, such as cameras or cell-phones provided with photographic equipment, are equipped with image acquisition sensors 1 being placed in a housing 2 provided with a housing cavity 3 and fixed to the housing 2 by interposition of an adhesive layer 1a, as shown in FIG. 1.

After electrically connecting by means of electrical wires 3a the sensor 1 and the housing 2, for example through wire bonding as shown in FIG. 2, the housing cavity 3 is then closed by a sealing lid 4 by interposition of an adhesive layer 4a. The lid 4 is for example glass made as shown in FIG. 3.

An optical group 5 is then fixed on the housing 2. Generally, the optical group 5 comprises a lens holder 6 and a lens barrel 7 wherein a lens 8 is placed and fixed to the holder 6, as shown in FIG. 4.

In particular, during a focusing step of the lens 8 with respect to the sensor 1, the holder 6 is integrally fixed to the housing 2 and the barrel 7 is shifted with respect to the holder 6 in order to find the right optical group 5 focusing point, as shown in FIG. 5.

Particularly, the barrel 7 can be rotated, horizontally and/or vertically shifted until the best focusing point position of the lens 8 is reached with respect to the sensor 1.

The right focusing point being found, the barrel 7 must be locked to the holder 6.

A first known technical solution to lock the barrel 7 to the holder 6 is shown in FIG. 6.

According to this solution, an adhesive layer 9 is interposed between the barrel 7 and the holder 6. In order to allow a stable fixing, mutually cooperating barrel 7 and holder 6 portions, during the fixing step, are provided with grooves 10 allowing the adhesive layer 9 to be better supported.

Although advantageous under many aspects, this first solution has several drawbacks.

Particularly, this kind of solution is essentially based on manual production, since it is difficult to control the dispensing of this adhesive layer 9 between the barrel 7 and the holder 6 in automatic production tools.

Moreover, as it is difficult to distribute uniformly the adhesive layer 9 between the barrel 7 and the holder 6, the lens 8 can easily lose the alignment with the sensor 1, since it has been verified that the barrel 7 is attracted in the direction where there is a higher quantity of adhesive layer.

A second solution to lock the barrel 7 to the holder 6 provides instead the use of a metallic undulated ring or made of materials being different from the ones forming the barrel 7 and the holder 6, which is interposed between the barrel 7 and the holder 6. The pressure exerted by the ring tends to keep the barrel 7 in position with respect to the holder 6.

Although responding to the aim, also this solution has some drawbacks.

In fact after focusing it is difficult for the ring to ensure that the relative position is kept between the barrel 7 and the holder 6.

Therefore the image acquisition devices manufactured with these known techniques are affected by repetitiveness problems, limiting the application thereof at industrial level, and increasing the production costs thereof. Particularly, shifting the lens focusing axis and/or point by a few microns with respect to the sensor, the image detected by the sensor itself is no longer uniform. Particularly, an image portion detected in correspondence with the lens edges is of considerably different quality than an image portion detected in correspondence with the lens center.

SUMMARY

An embodiment of the present invention provides a method for fixing an optical lens with respect to an optical sensor in electronic devices capable of acquiring images. This embodiment has such functional characteristics as to allow a stable fixing, thus overcoming limits and drawbacks still affecting prior-art methods.

More specifically, this embodiment of the present invention fixes by welding an upper holder containing an optical lens to a lower holder integrally connected to a housing containing an optical sensor, just after finding the alignment between the lens and the sensor. Advantageously, this welding may be performed on one or more points by means of ultrasound.

BRIEF DESCRIPTION OF THE DRAWINGS

Features and advantages of methods and devices according to the invention will be apparent from the following description of an embodiment thereof given by way of non limiting example with reference to the attached drawings.

DETAILED DESCRIPTION

With reference to FIGS. 7 to 10, a method is described according to an embodiment of the invention for fixing an optical group comprising an optical lens with respect to an optical sensor in an image acquisition device.

For simplicity of illustration, elements being structurally and functionally similar or identical to prior art elements will be given the same numeral references.

Figure 1:
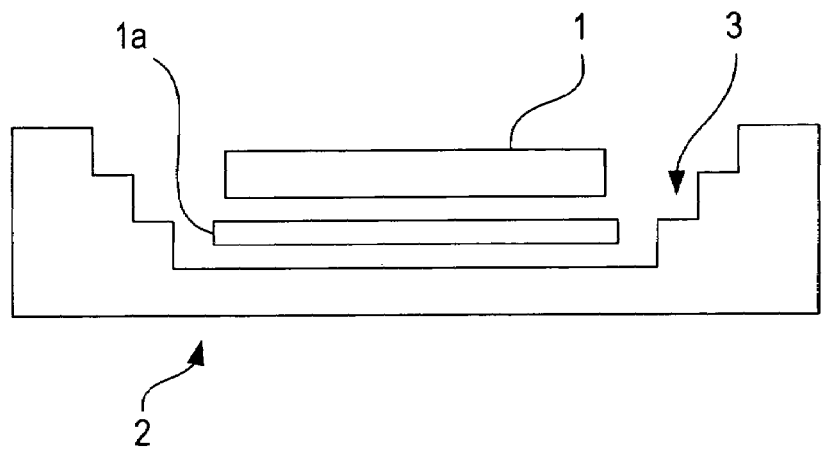
FIGS. 1 to 6 are vertical section views of an image acquisition device during the focusing and fixing operations according to the prior art.
Figure 2:
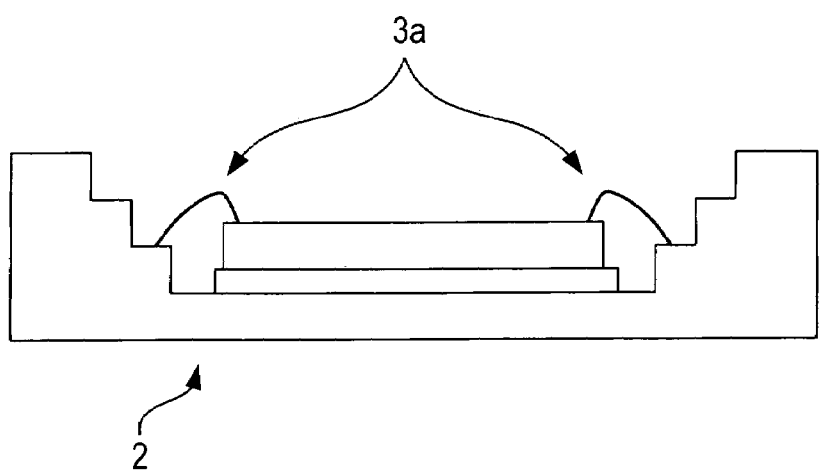
Figure 3:
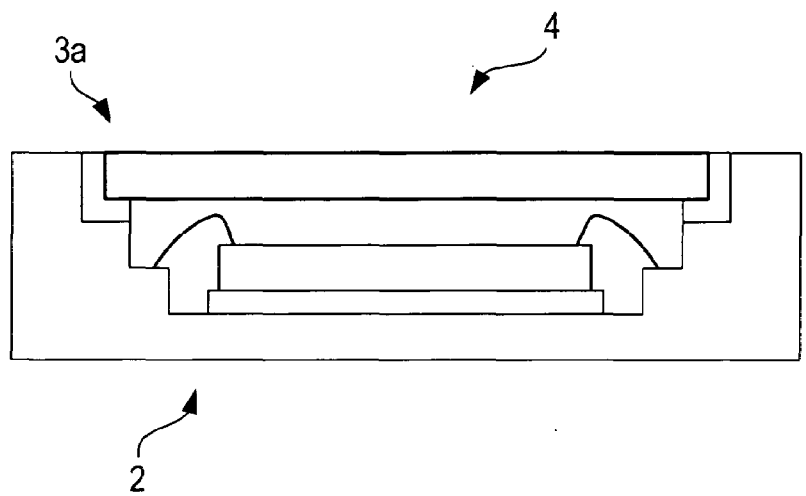
Figure 4:
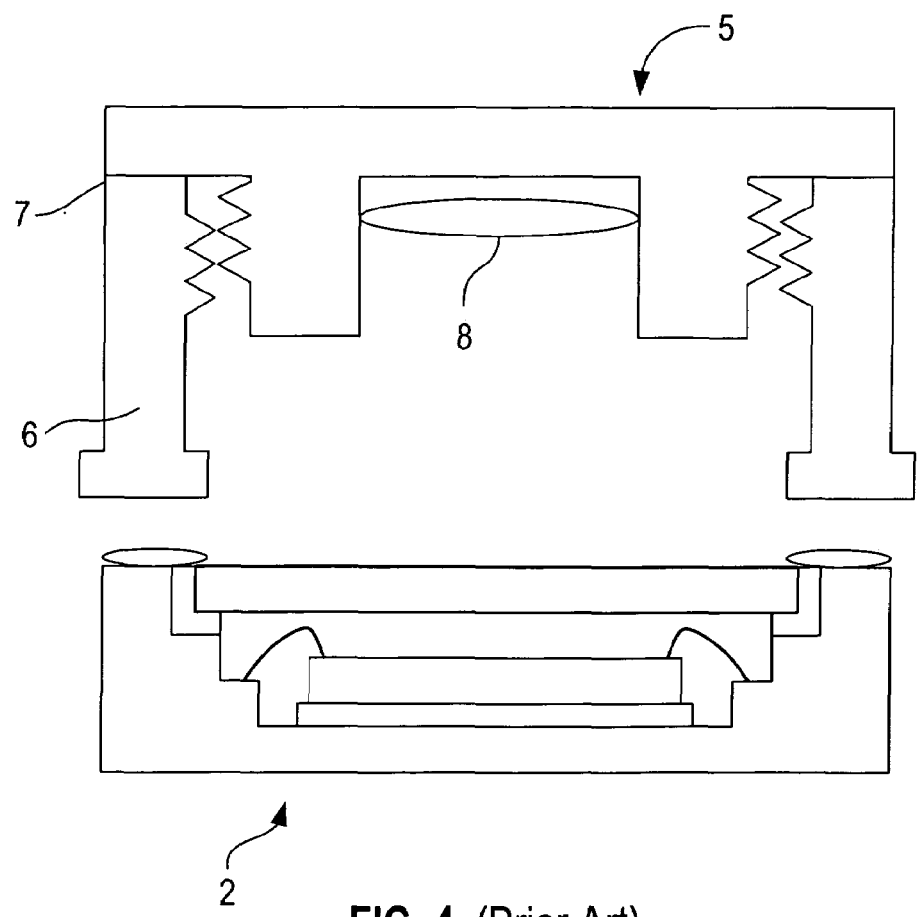
Figure 5:
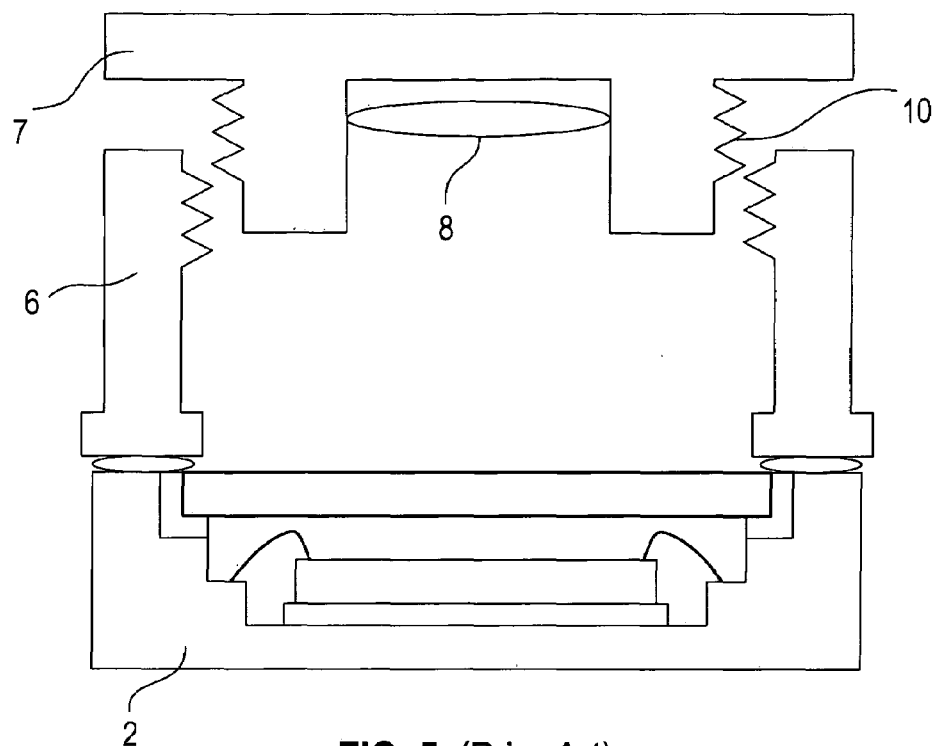
Figure 6:
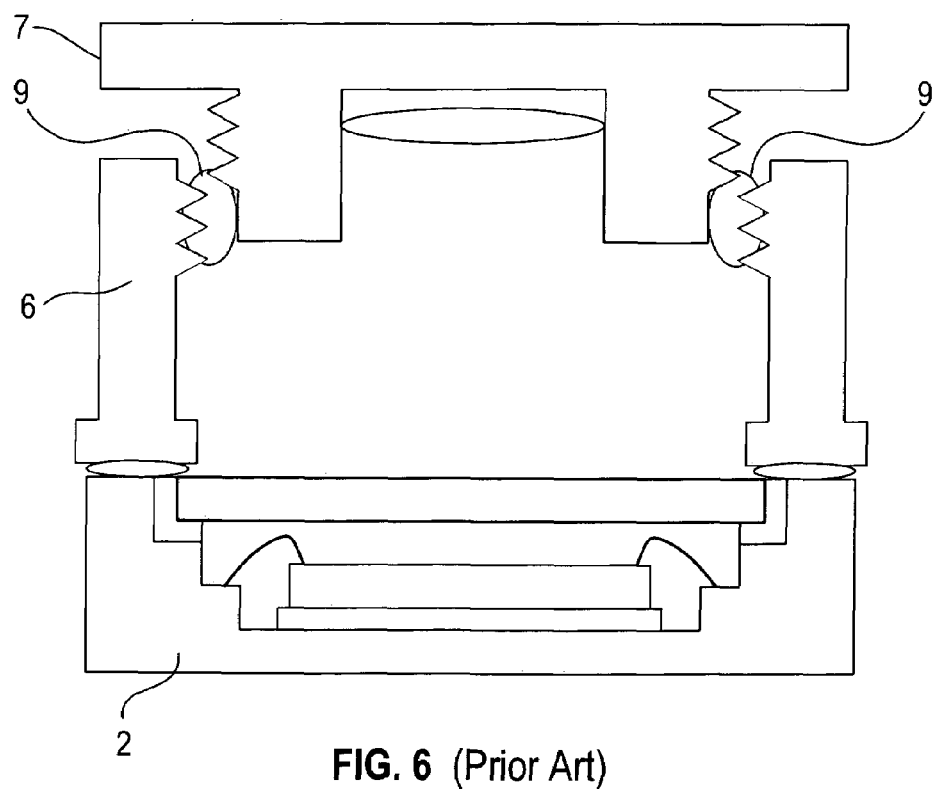

As already described with reference to the prior art, in an image acquisition device, an image acquisition sensor 1 is placed in an housing 2 provided with a housing cavity 3 and it is fixed to the housing 2 by interposition of an adhesive layer 1a as shown in FIG. 1.

After electrically connecting by means of electrical wires 3a the sensor 1 and the housing 2, for example through wire bonding, the housing cavity 3 is closed by a sealing lid 4 by interposition of an adhesive layer 4a. The lid 4 is for example glass made.

Figure 7:
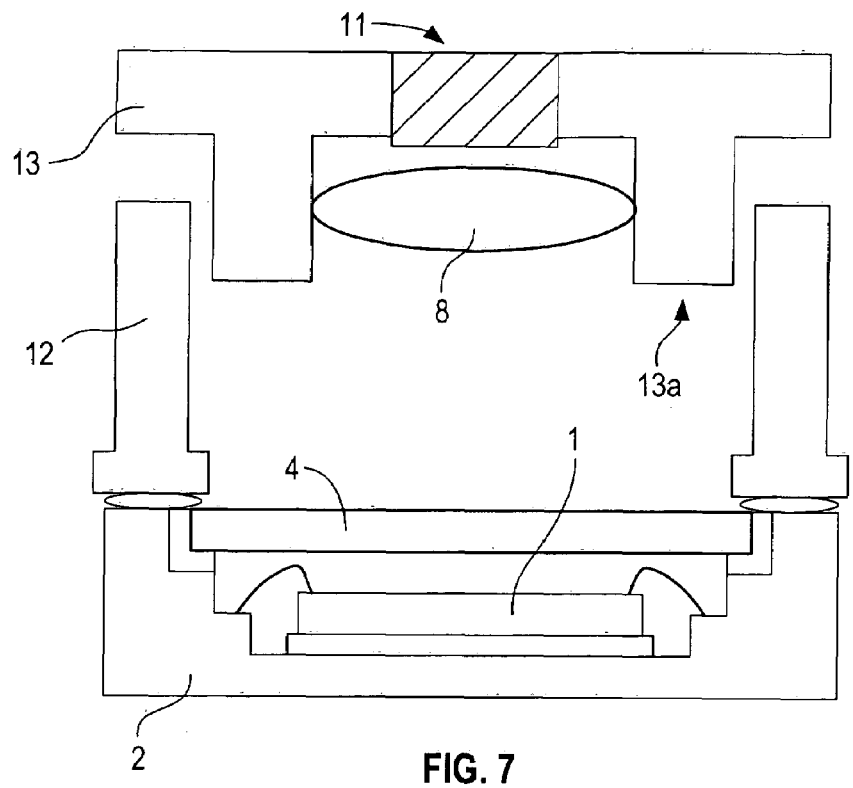
FIG. 7 is a vertical section view of an image-acquisition device during a welding step of a method according to an embodiment of the invention.

Referring to FIG. 7, according to an embodiment of the invention, an optical group 11 is then fixed on the housing 2. The optical group 11 comprises a lower holder 12 called a lens holder and an upper holder 13 called a lens barrel wherein a lens 8 is placed and which is fixed to the lower holder 12. The upper holder 13 has at least a retention portion 13a, corresponding to a holding area of the lens 8, having such a size as to be placed in the lower holder 12.

In particular, during an alignment or focusing step of the lens 8 of the optical group 11 with respect to the sensor 1, the lower holder 12 is integrally fixed to the housing 2 and the upper holder 13 is shifted with respect to the lower holder 12.

Particularly, the upper holder 13 can be rotated, horizontally and/or vertically shifted until an optimum focusing point position of the lens 8 is reached with respect to the sensor 1.

Advantageously, this focusing step is performed by acquiring a series of images caught by the sensor 1 through the lens 8 and locking the upper holder 13 in the position wherein an image is detected as being perfectly or nearly perfectly in focus in the desired points.

The optimum position of the lens 8 being found, the upper holder 13 is locked to the lower holder 12.

According to an embodiment of the invention, the upper holder 13 is fixed to the lower holder 12 by welding. Particularly, a plurality of energy rays are incident on the upper holder 13 so as to weld the upper holder 13 to the lower holder 12.

Advantageously, the lower holder 12 is thinner in correspondence with the incident points of those energy rays.

Laser energy can be used for the welding. Actually, the use of laser energy has some drawbacks in this particular field of application. In fact during the welding process, the laser may produce dust or soot which can fall into the image acquisition device and thus deposit on the lid 4 protecting the sensor 1 or on the lens 8, preventing a correct operation and an accurate image acquisition. Moreover, the particles forming these dusts can be "mobile" in the cavity formed by the lid 4 and the group comprising the lower holder 12 and the upper holder 13, jeopardizing the stability of the final image acquisition.

Moreover a minimal change of the material or of the laser probe's relative position may cause a considerable welding leakage.

In a particularly advantageous embodiment of the invention, a beam of ultrasound is used to perform the welding.

Figure 9:
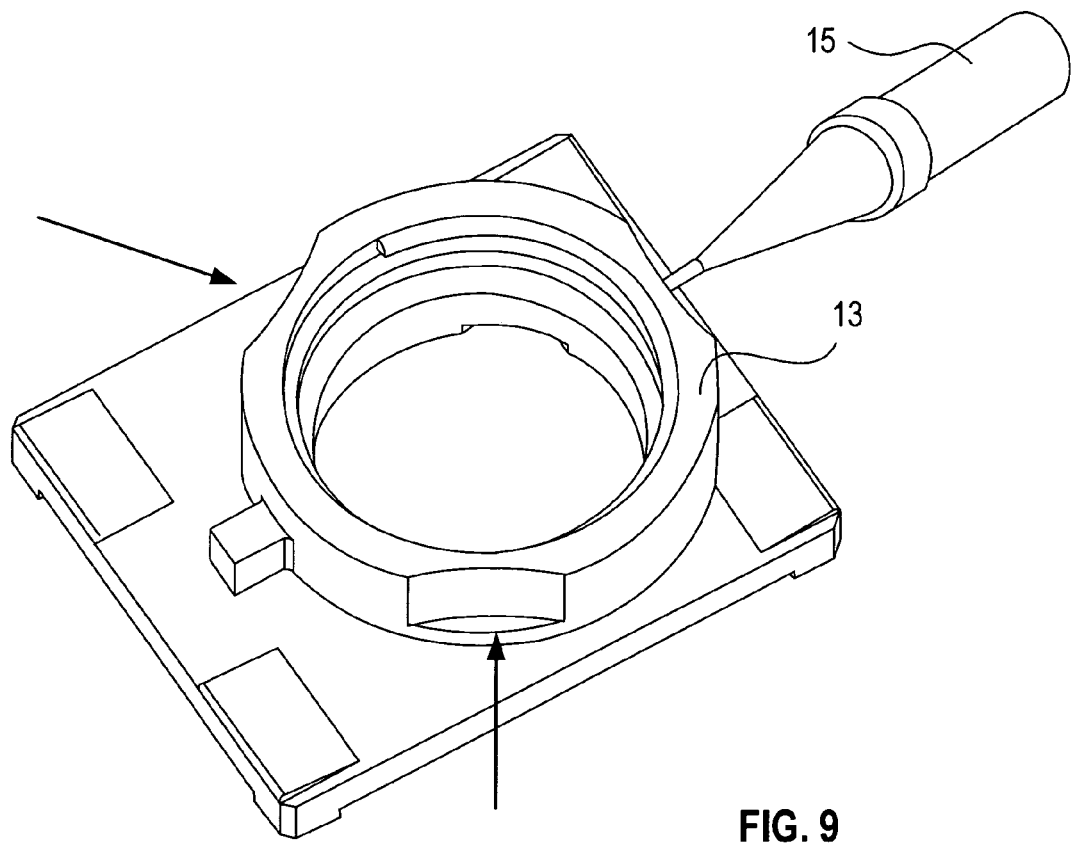
FIG. 9 is a perspective view of the image acquisition device obtained with a method according to an embodiment of the invention during the welding step.
Figure 10:
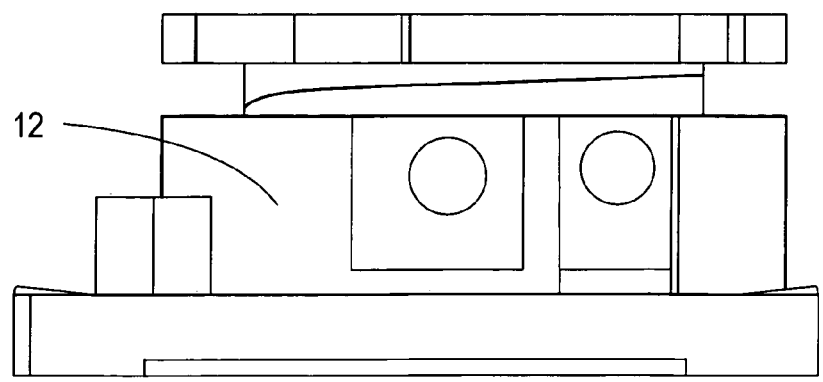
FIG. 10 is a side view of an image acquisition device obtained with a method according to an embodiment of the invention after the welding step.

Particularly, referring to FIG. 9, an ultrasonic transducer 15 is used, which vibrates at high frequency and turns the vibration energy into thermal energy. This ultrasonic transducer 15 is put into contact with the upper holder 13, and melts the interfaces between the upper holder 13 and the lower holder 12 in the area concerned only. In other words, the energy lost by the vibrating ultrasonic transducer 15 when it is in contact with the surface to be welded is transformed into heat by melting together the two plastic interfaces forming the upper holder 13 and the lower holder 12.

For a more uniform fixing several different ultrasonic transducers can be used to perform the welding, these ultrasonic transducers being located in a single plane and being arranged with each other so as to be symmetrically distributed along the lower holder 12 perimeter. In a preferred embodiment there are three ultrasonic transducers and they are located at 120° from each other, as shown in FIG. 9 by arrows and the transducer 15.

Figure 8:
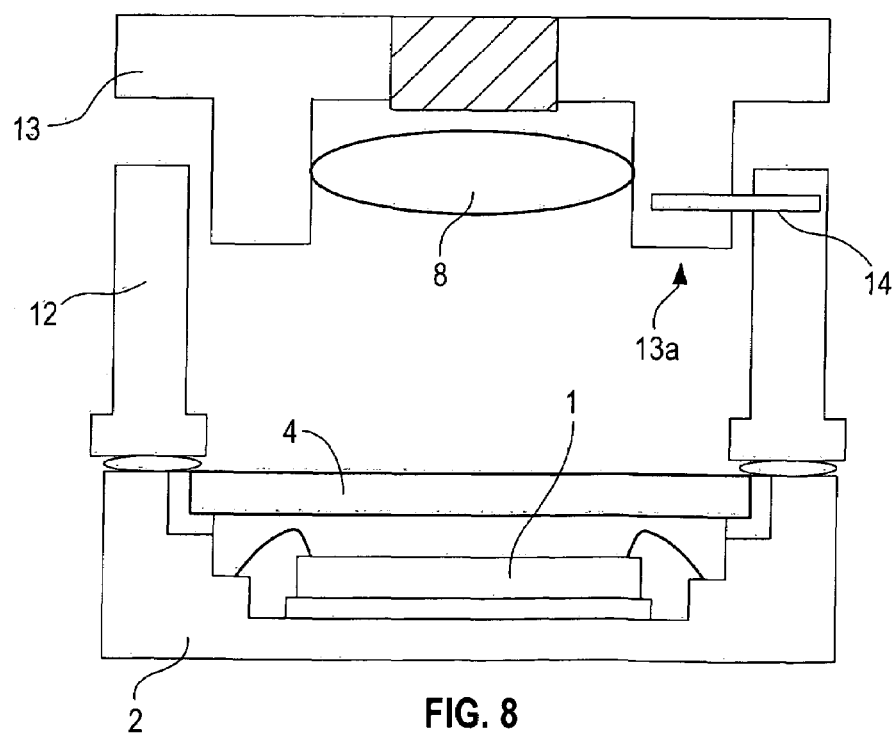
FIG. 8 is a vertical section view of an alternative embodiment of an image acquisition device during a welding step of a method according to the invention.

Advantageously, referring to FIG. 8, a stiffening portion 14 of the ultrasonic transducer 15 can be part of a module which is incorporated in the welding itself, thus stiffening the weld. The stiffening portion 14 not only melts the two interfaces, but also locks them together mechanically. For example, the stiffening portion 14 can melt an opening in the holders 12 and 13 as the transducer 15 pushes it against and then into these holders. Once inserted into the holders 12 and 13, the portion 14 can further melt the holders to weld the holders to each other and to the portion 14. When the transducer 15 is withdrawn, the portion 14 remains in the hole to strengthen the attachment of the holder 12 to the holder 13 in that region.

Advantageously, the frequency range used for the ultrasound welding goes from 20 to 80 kHz in one embodiment of the invention.

According to another advantageous embodiment of the invention, the welding can be performed by means of a thermal probe. Particularly, one or more ultrasonic transducers are used, which are heated to a higher temperature than the melting temperature(s) of the material forming the upper holder 13 and the lower holder 12, and which are put into contact with the upper holder 13. The heat is then transferred from the thermal probe to the material, melting it and thus forming a welding among the interfaces between the upper holder 13 and the lower holder 12.

The ultrasound welding, as well as the thermal welding, can be easily controlled since the energy is better distributed in the welding itself and dusts are typically not produced, which dust might degrade the performance of the image acquisition final device as discussed above in conjunction with the use of laser energy.

Moreover, these types of welding are much more stable than the destructive torque used to control the manufacturing process quality.

In conclusion, the fixing methods according to the above-described embodiments of the invention do not impose particular size or design constraints to the supports 12 and 13.

Moreover these fixing methods are not limited to the fixing of the retention portion sides 13a to the holder 12, because any part of the holder 13 can be welded to any adjacent part of the lower holder 12.

Advantageously, moreover, the fixing methods according to the above-described embodiments of the invention do not require threads for fixing the upper holder 13 to the lower holder 12. Particularly, the interfaces between the lower holder 12 and the upper holder 13 do not need to be threaded and thus may be of simple construction.

Finally, the above-described fixing methods can be used in many types of image acquisition device.

Advantageously, the fixing methods according to the above-described embodiments of the invention can be easily automated. That is, the steps and the material used can be easily integrated in a traditional manufacturing process of protective packages.

In conclusion, the methods according to embodiments of the invention allow an ultrasound or thermal welding to be performed, or a combination thereof, i.e., of the thermosonic type, to fix an optical lens of an optical group with respect to a sensor, the welding being easily controllable in terms of quality and in real time. This control is available by feedback of the ultrasound or thermosound signals and of the energy used on the welding: for example amplitude, frequency, impedance, energy and other parameters not directly linked to the transducer or probe, to control, for example, the penetration speed, the final welding point, and the starting and final ultrasound points.

From the foregoing it will be appreciated that, although specific embodiments of the invention have been described herein for purposes of illustration, various modifications may be made without deviating from the spirit and scope of the invention.

What is claimed is:

1. A method for fixing a lens in an optical group with respect to an optical sensor in an image acquisition device comprising the steps of:
   housing said optical sensor in a housing,
   fixing a lower holder of said optical group to said housing;
   aligning an upper holder of said optical group, wherein said lens is placed, with said sensor so as to align a focusing point of said lens with respect to said sensor,
   welding said upper holder to said lower holder.

2. A method according to claim 1 wherein said welding step occurs by means of at least an energy beam.

3. A method according to claim 2 wherein said welding step includes the use of a plurality of energy beams in correspondence with a plurality of points of said lower and upper holders.

4. A method according to claim 3 wherein a plurality of beams are arranged in a plane and form between one another essentially identical angles.

5. A method according to claim 3 further comprising a configuration step wherein said upper holder is thinned in correspondence with the points wherein said welding is performed before performing said welding step.

6. A method according to claim 1 wherein said welding step occurs by means of at least an ultrasound beam.

7. A method according to claim 1 wherein said welding step occurs by means of at least a thermal beam.

8. A method according to claim 7 wherein said welding step is performed by means of an ultrasonic transducer comprising at least a stiffening portion effective to be incorporated in a welding area realized by said welding step.

9. A method according to claim 1 wherein said welding step occurs by means of at least a thermosonic beam.

10. A method according to claim 1 wherein said alignment step is performed by acquiring a series of images with said sensor through said lens and locking said upper holder in a position wherein an image acquired is in focus.

11. An image acquisition device comprising an optical sensor placed in a housing and an optical group comprising in turn a lower holder fixed to said housing and an upper holder wherein said lens is placed, wherein said upper holder and said lower holder have at least a welding point between each other.

12. An image acquisition device according to claim 11 wherein said upper and lower holders have a plurality of welding points between them.

13. An image acquisition device according to claim 12 wherein said plurality of welding points is symetrically distributed along the perimeter of said lower holder.

14. An image acquisition device according to claim 11 wherein at least one welding point comprises a stiffening portion.

15. A method, comprising:
    positioning a lens relative to an image sensor; and
    securing the lens in a desired position by welding a lens holder to a lens support having a position that is fixed relative to the sensor.

16. The method of claim 15 wherein positioning the lens comprises:
    positioning the lens in multiple orientations relative to the image sensor;
    capturing a respective image at each orientation with the image sensor; and
    selecting the desired position of the lens as the orientation corresponding to the image having the highest quality.

17. The method of claim 15 wherein welding the lens holder comprises directing an ultrasound beam at adjacent regions of the lens holder and support.

18. The method of claim 15 wherein welding the lens holder comprises melting together adjacent regions of the lens holder and support.

19. The method of claim 15 wherein welding the lens holder comprises directing thermal energy at adjacent regions of the lens holder and support.

20. The method of claim 15 wherein welding the lens holder comprises directing a laser beam at adjacent regions of the lens holder and support.

21. The method of claim 15 wherein positioning the lens holder comprises positioning the lens holder inside of the lens support.

22. The method of claim 15 wherein welding the lens holder comprises:
    inserting a stiffening member through the lens holder and the lens support; and
    melting the lens holder and the lens support to the stiffening member.

23. The method of claim 15 wherein welding the lens holder comprises:
    inserting a stiffening member through the lens holder and the lens support; and
    attaching the lens holder and the lens support to the stiffening member.

24. A method, comprising:
    positioning a lens relative to an image sensor; and
    securing the lens in a desired position by melting a region of a lens holder to a region of a lens support having a position that is fixed relative to the sensor.

25. The method of claim 24 wherein melting a region comprises:
    melting a region of the lens holder;
    melting an adjacent region of the lens support; and
    allowing the melted regions to resolidify such that the region of the lens holder bonds to the region of the lens support.

26. The method of claim 24 wherein melting a region comprises applying ultrasound energy to at least one of the regions of the lens holder and lens support.

27. A method, comprising:
positioning a lens relative to an image sensor; and
securing the lens in a desired position by heating adjacent regions of a lens holder and a lens support having a position that is fixed relative to the sensor such that the adjacent regions bond together.

28. The method of claim 27 wherein heating the adjacent regions comprises applying ultrasound energy to at least one of the regions of the lens holder and lens support.

29. An imaging device, comprising:
a housing;
an image sensor secured to the housing;
a lens support secured to the housing;
a lens holder welded to the lens support; and
a lens disposed in the lens holder and optically aligned with the image sensor.

30. The imaging device of claim 29 wherein a portion of the lens holder is disposed inside of the lens support.

31. The imaging device of claim 29, further comprising:
wherein the lens holder is welded to the lens support at a site; and
a stiffening member disposed within portions of the lens holder and lens support at the site.

32. The imaging device of claim 29 wherein the lens holder is welded to the lens support at multiple sites.

33. The imaging device of claim 29 wherein the lens holder is ultrasonically welded to the lens support.

34. The imaging device of claim 29, further comprising:
a stiffening member disposed within adjacent portions of the lens holder and lens support; and
wherein the lens holder and lens support are welded to the stiffening member and the lens holder is spaced apart from the lens support adjacent to the stiffening member.

35. The imaging device of claim 29, further comprising:
a stiffening member disposed within adjacent portions of the lens holder and lens support; and
wherein one of the lens holder and lens support is welded to the stiffening member and the lens holder and lens support are in contact with each other adjacent to the stiffening member.

36. An imaging device, comprising:
a housing;
an image sensor secured to the housing;
a lens support secured to the housing;
a lens holder melted to the lens support; and
a lens disposed in the lens holder and optically aligned with the image sensor.

37. The imaging device of claim 36, further comprising:
wherein the lens holder is melted to the lens support at a site; and
a stiffening member disposed within portions of the lens holder and lens support at the site.

38. The imaging device of claim 36, further comprising:
a stiffening member disposed within adjacent portions of the lens holder and lens support; and
wherein the lens holder and lens support are melted to the stiffening member and the lens holder is spaced apart from the lens support adjacent to the stiffening member.

39. The imaging device of claim 36, further comprising:
a stiffening member disposed within adjacent portions of the lens holder and lens support; and
wherein one of the lens holder and lens support is melted to the stiffening member and the lens holder is in contact with the lens support adjacent to the stiffening member.

* * * * *